US011655145B2

(12) United States Patent
Sone et al.

(10) Patent No.: US 11,655,145 B2
(45) Date of Patent: May 23, 2023

(54) MEMS VIBRATOR AND MEMS OSCILLATOR

(71) Applicant: KANEKA CORPORATION, Osaka (JP)

(72) Inventors: Junji Sone, Kanagawa (JP); Mutsuaki Murakami, Osaka (JP)

(73) Assignee: KANEKA CORPORATION, Osaka (JP)

( * ) Notice: Subject to any disclaimer, the term of this patent is extended or adjusted under 35 U.S.C. 154(b) by 291 days.

(21) Appl. No.: 17/007,891

(22) Filed: Aug. 31, 2020

(65) Prior Publication Data

US 2020/0399120 A1 Dec. 24, 2020

Related U.S. Application Data

(63) Continuation of application No. PCT/JP2019/007003, filed on Feb. 25, 2019.

(30) Foreign Application Priority Data

Mar. 1, 2018 (JP) .............................. JP2018-036682

(51) Int. Cl.
*B81C 1/00* (2006.01)
*B81B 7/00* (2006.01)

(52) U.S. Cl.
CPC ........ *B81C 1/00325* (2013.01); *B81B 7/0016* (2013.01); *B81C 1/00269* (2013.01);
(Continued)

(58) Field of Classification Search
CPC ............ B81C 1/00325; B81C 1/00269; B81C 2203/0118; B81B 7/0016;
(Continued)

(56) References Cited

U.S. PATENT DOCUMENTS 5,043,185 A    8/1991   Murakami et al.
5,064,019 A    11/1991  Murakami et al.
(Continued)

FOREIGN PATENT DOCUMENTS

EP    3007206 A1    4/2016
JP    H01259698 A   10/1989
(Continued)

OTHER PUBLICATIONS

Isono et al. ("Carbonization and graphitization of shaving filed away from Kapton," Carbon, 42, pp. 1799-1805, 2004) (Year: 2004).*
(Continued)

*Primary Examiner* — Yasser A Abdelaziez
(74) *Attorney, Agent, or Firm* — Osha Bergman Watanabe & Burton LLP

(57) ABSTRACT

The present disclosure relates to a MEMS vibrator or the like that has excellent chemical resistance and an excellent mechanical strength and that is easily thinned. The present disclosure is a MEMS vibrator comprising: a vibrating film including a graphite film; and a silicon member supporting the vibrating film, the graphite film having a thickness of 50 nm or more and less than 20 μm, and the graphite film having a Young's modulus along a graphite film plane direction of 700 GPa or more.

13 Claims, 6 Drawing Sheets

(52) U.S. Cl.
CPC ............... *B81B 2201/0285* (2013.01); *B81C 2203/0118* (2013.01)

(58) Field of Classification Search
CPC .......... B81B 2201/0285; H03H 9/2457; H03H 9/2463; H03H 9/02393; H03H 2003/027; H03H 2009/02251; H03H 2009/02322; H03H 3/0072; H03H 9/2405
See application file for complete search history.

(56) References Cited

U.S. PATENT DOCUMENTS

| | | | |
|---|---|---|---|
| 5,178,804 A * | 1/1993 | Watanabe | B29C 43/003 264/331.12 |
| 5,658,698 A | 8/1997 | Yagi et al. | |
| 6,020,215 A | 2/2000 | Yagi et al. | |
| 10,823,630 B1 * | 11/2020 | Dong | G01L 9/0047 |
| 2004/0256552 A1 | 12/2004 | Kawakatsu | |
| 2005/0112621 A1 | 5/2005 | Kim et al. | |
| 2006/0231757 A1 | 10/2006 | Kawakatsu | |
| 2006/0253943 A1 | 11/2006 | Kawakatsu | |
| 2007/0018096 A1 | 1/2007 | Kawakatsu | |
| 2010/0050415 A1 | 3/2010 | Desai | |
| 2013/0062104 A1 * | 3/2013 | Craighead | B81B 3/0094 977/734 |
| 2016/0147141 A1 | 5/2016 | Ono et al. | |

FOREIGN PATENT DOCUMENTS

| | | |
|---|---|---|
| JP | H07329237 A | 12/1995 |
| JP | 2003114182 A | 4/2003 |
| JP | 2003211396 A | 7/2003 |
| JP | 2005156526 A | 6/2005 |
| JP | 2009060456 A | 3/2009 |
| JP | 2011060846 A | 3/2011 |
| JP | 2012150350 A | 8/2012 |
| JP | 2012244349 A | 12/2012 |
| JP | 2014053763 A | 3/2014 |
| JP | 2017103369 A | 6/2017 |

OTHER PUBLICATIONS

Tanaka et al., Review Paper MEMS Technology, Science and Industry, vol. 85, No. 2, 2011, pp. 49-56, with Partial English Translation (12 pages).
International Search Report issued in International Application No. PCT/JP2019/007003, dated May 7, 2019 (2 pages).
Written Opinion issued in International Application No. PCT/JP2019/007003, dated May 7, 2019 (6 pages).
Extended European Search Report issued in corresponding European Application No. 19760832.6 dated Oct. 28, 2021 (9 pages).

* cited by examiner

[Fig. 2]
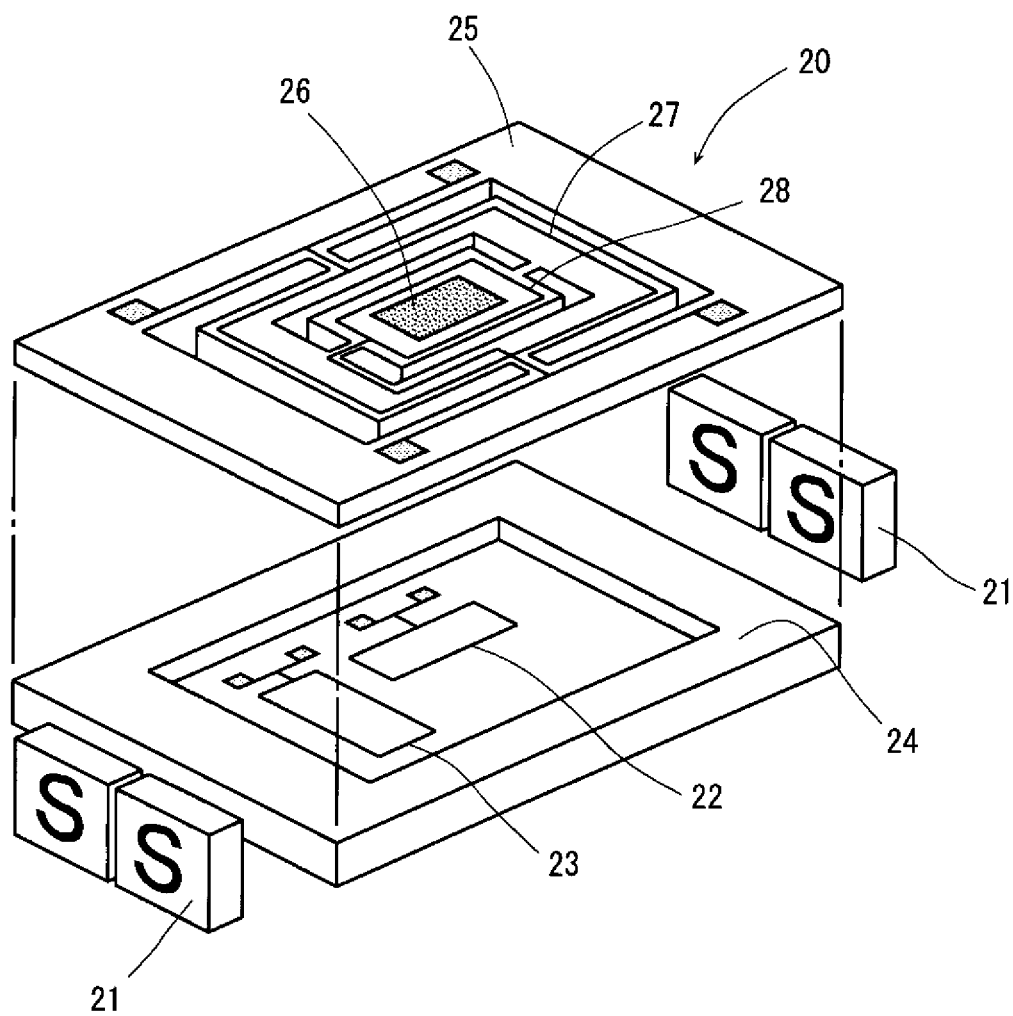

[Fig. 3A]
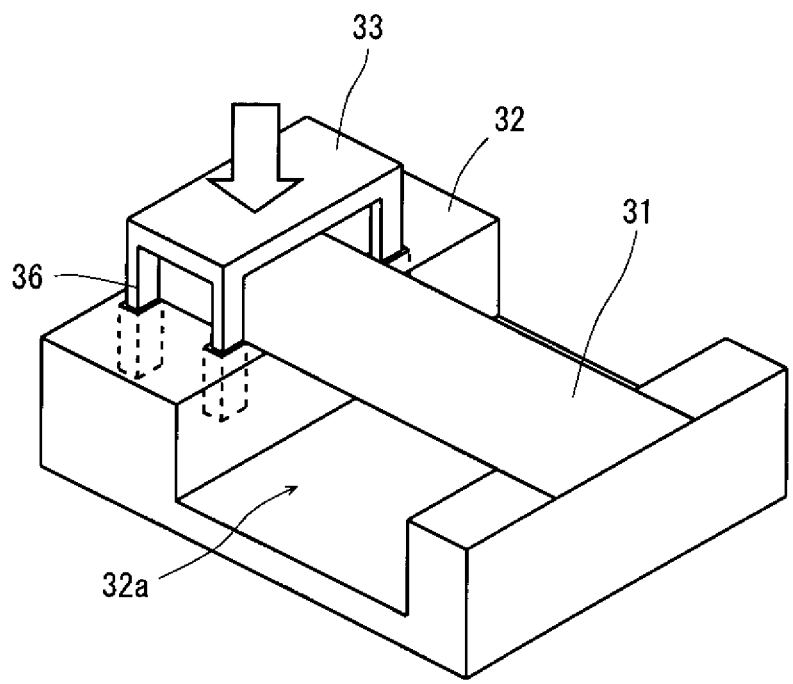
[Fig. 3B]
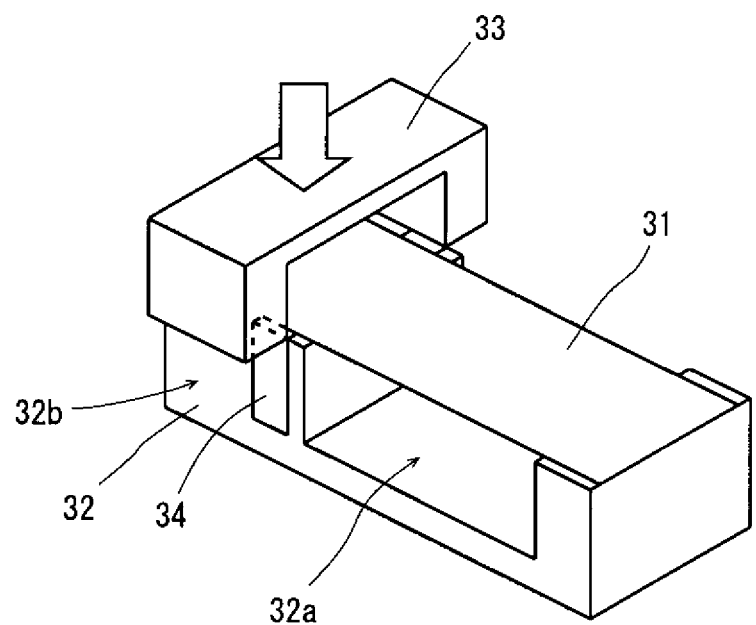

[Fig. 4A]
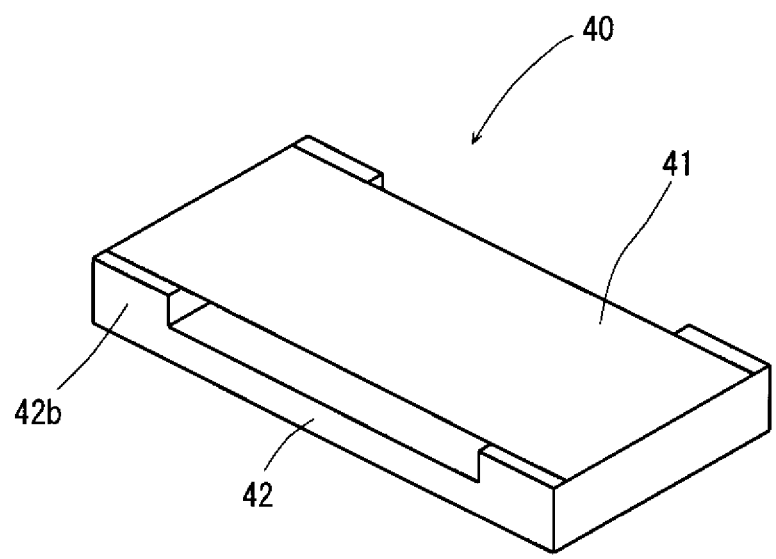
[Fig. 4B]
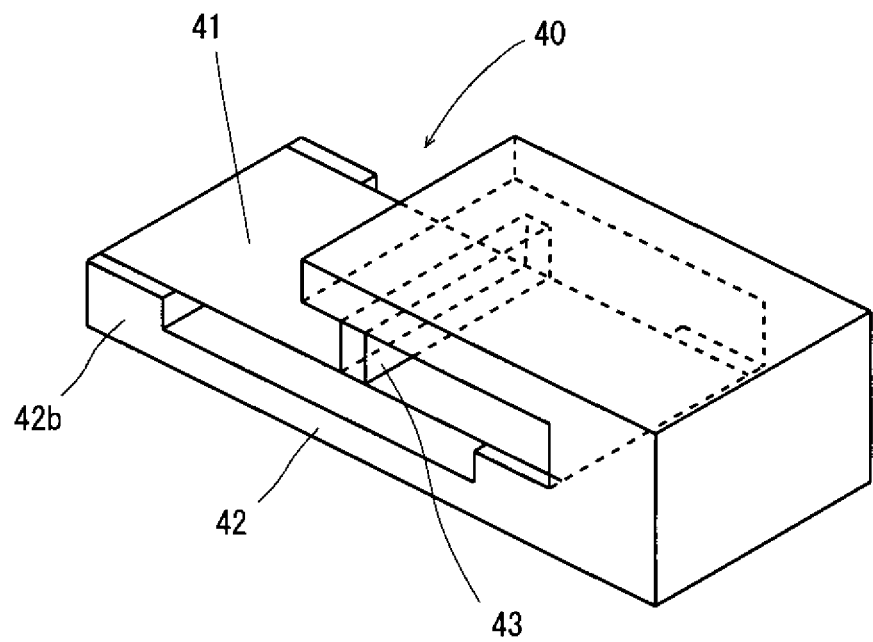

[Fig. 5A]
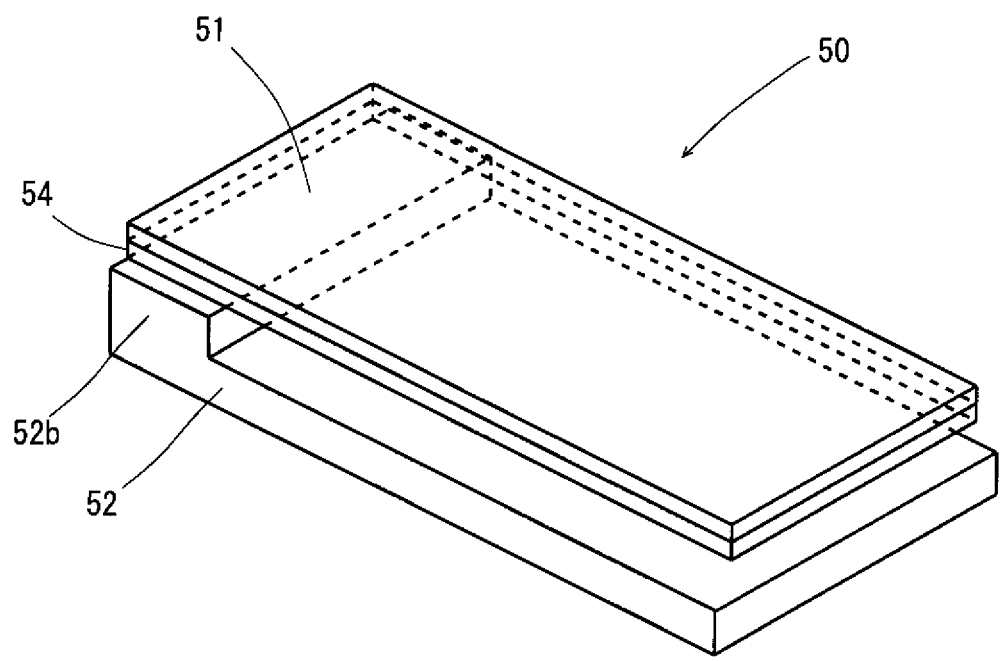
[Fig. 5B]
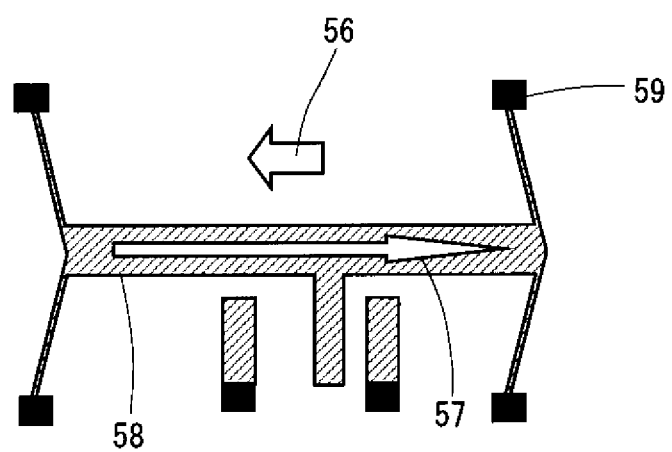

[Fig. 6]
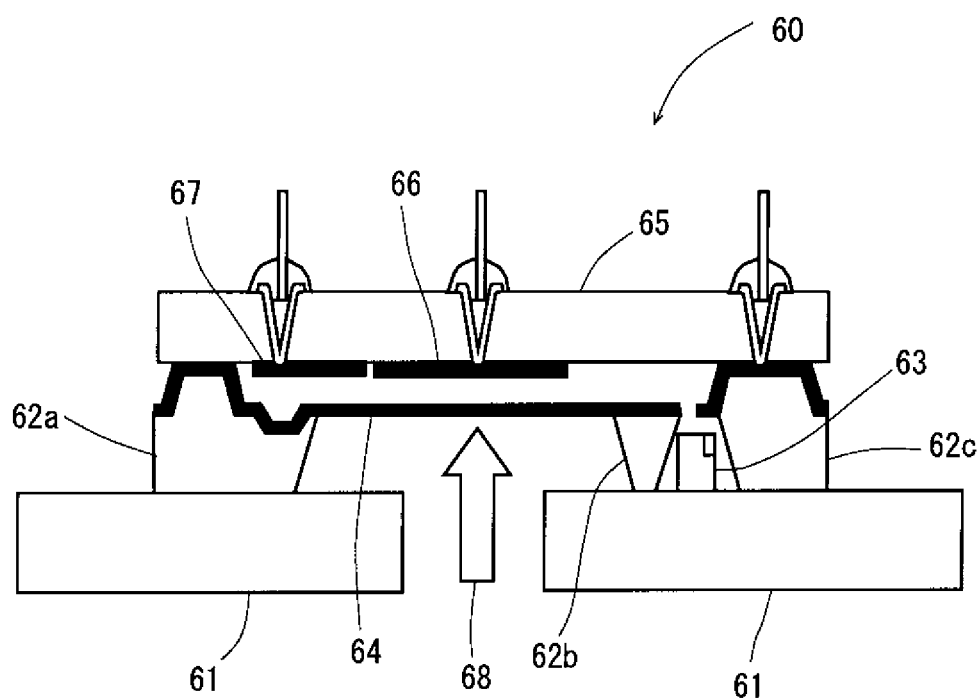

MEMS VIBRATOR AND MEMS OSCILLATOR

TECHNICAL FIELD

One or more embodiments of the present disclosure relate to a MEMS vibrator and a MEMS oscillator each including a graphite film, and further to an electronic device such as a MEMS sensor or actuator including the MEMS oscillator.

BACKGROUND

Oscillators are used in any electronic devices from clocks to TVs and personal computers that need a timing signal. Oscillators have been conventionally used that include a crystal vibrator generating a frequency of about 10 to 64 MHz, and oscillators (hereinafter, referred to as silicon-MEMS oscillators) are recently used that include a MEMS (Micro-electromechanical system) vibrator (hereinafter, referred to as a silicon-MEMS vibrator) including silicon as a resonator. For example, a silicon-MEMS oscillator of Si-Time Corp. has a structure combining a programmable integrated circuit (oscillator IC) with a silicon-MEMS vibrator, and a die including the oscillator IC and a die including the silicon-MEMS vibrator are sealed by wire bonding or flip-chip bonding and formed into a plastic package or a CSP (Chip-scale package). MEMS products include the silicon-MEMS oscillators as well as gyro sensors, actuators, and the like including the silicon-MEMS oscillators, and performance of the silicon-MEMS oscillators is being heightened.

Such a conventional MEMS product has included, as a resonator (vibration source), a semiconductor material such as Si or SiGe, which is used for a mechanically vibrating portion, a spring, or the like. Si, however, has a Young's modulus of as low as 130 GPa, and further has a problem of being easily cracked. SiGe has about the same Young's modulus as Si and thus also has a problem (Non-Patent Document 1).

Such conventional silicon-MEMS oscillators including silicon as a resonator have particular mechanical characteristics and are required to be further improved also in terms of tribology, coefficient of thermal expansion characteristics, and thermal conductivity. Further, the silicon-MEMS oscillators have vibration characteristics that are largely affected by environmental temperature. In order not to allow the silicon-MEMS oscillator to be affected by temperature, the silicon-MEMS oscillator needs to be formed into a complicated structure and thus increased in stiffness. FIG. 1 is an example of the conventional silicon-MEMS oscillator. In FIG. 1, a silicon-MEMS oscillator 10 includes a silicon substrate 11, a $SiO_2$ layer 12, a Si layer (SOI layer: Silicon on Insulator layer) 19, a Si epitaxial layer 13, and a Poly-Si layer 18 stacked in this order, an electrostatically driven comb-shaped silicon resonator 14 is disposed so as to penetrate the Si layer (SOI layer) 19, the $SiO_2$ layer 12 includes both end portions of the comb-shaped silicon resonator 14, and the comb-shaped silicon resonator 14 is, for the electrostatic drive, connected to an oscillator IC (not shown) including an analog oscillator circuit or the like. A MEMS terminal 16 and a CMOS (complementary metal-oxide semiconductor) 17 are disposed on the Poly-Si layer 18. As shown as an example in the drawing, the silicon-MEMS vibrator has a complicated structure and requires many processing man-hours for the production, so that it is difficult to commercialize a MEMS product that includes a vibrator having a simple both-end fixed beam structure.

As a MEMS product, an optical scanner shown in FIG. 2 is also known that includes a Si wafer as a resonator. An optical scanner 20 shown as an example in the drawing includes a Si wafer 25 disposed above glass 24 including a detection coil 23 around X-axis and a detection coil 22 around Y-axis, the Si wafer 25 including a mirror 26, a driving coil-containing rotating plate 27 around X-axis, and a driving coil-containing rotating plate 28 around Y-axis, and permanent magnets 21 are disposed so as to sandwich the glass 24 and form a pair. Such an optical scanner includes a Si wafer, so that it is difficult to decrease the thickness of the optical scanner.

Further, Si and other semiconductor materials are easily etched by chemicals or gasses and are inferior in chemical resistance. Therefore, when Si or other semiconductor materials are used as a resonator in the MEMS products, particularly as a diaphragm of a sensor, the purpose of use of the MEMS products (sensor) is limited. Further, when the MEMS product including Si or another semiconductor material as a resonator is used for a microchannel (micro TAS (micro Total Analysis Systems) or Lab on a Chip), the purpose of use of the MEMS products is also limited.

On the other hand, as an example of using a carbon material for an acoustic vibrating plate, a method for baking a polymer film to prepare a graphite film has been known, and a vibrating plate and an electric acoustic transducer each including the graphite film prepared by this approach, and a method for producing the vibrating plate are proposed (Patent Document 1).

PATENT DOCUMENT

Patent Document 1: JPH1-259698A

NON-PATENT DOCUMENT

Non-Patent Document 1: Shuji Tanaka, Masayoshi Esashi, Review Paper MEMS technology, Science and Industry 85 (2), 2011, pp. 49-56

SUMMARY

Conventional silicon-MEMS oscillators have problems of strength of a silicon resonator, chemical resistance, and the like. According to the description in EXAMPLES and the conventional art section of Patent Document 1 that uses a carbon material as an acoustic vibrating plate, use of a 50-μm-thick polyimide as a raw material gives a graphite film having a Young's modulus of 692 GPa when treated at a highest treatment temperature of 2800° C. and a graphite film having a Young's modulus of 750 GPa when treated at a highest treatment temperature of 3000° C. As pointed out by Patent Document 1, however, the graphite film obtained by the method of Patent Document 1 has a low mechanical strength for the use as the vibrating plate and is required to be improved in tensile strength by impregnating the graphite film with an organic polymer. Further, the vibrating plate obtained in Patent Document 1 has a thickness of at least 25 ti m or more and is too thick to be used as a MEMS vibrator.

Therefore, one or more embodiments of the present disclosure relate to a MEMS vibrator that has excellent chemical resistance and an excellent mechanical strength and that is easily thinned, and an oscillator, a compact actuator, a MEMS sensor, a MEMS channel, and a micro bio reaction circuit each including the MEMS vibrator.

In order to achieve the above purpose, the below means are used in one or more embodiments of the present disclosure.

[1] A MEMS vibrator comprising:
a vibrating film including a graphite film; and
a silicon member supporting the vibrating film,
the graphite film having a thickness of 50 nm or more and less than 20 μm, and
the graphite film having a Young's modulus along a graphite film plane direction of 700 GPa or more.
[2] The MEMS vibrator according to [1], wherein the graphite film has a tensile strength of 50 MPa or more.
[3] The MEMS vibrator according to [1] or [2], wherein the vibrating film is directly bonded with the silicon member.
[4] The MEMS vibrator according to [1] or [2], wherein the vibrating film and the silicon member are bonded with each other with a metal layer.
[5] The MEMS vibrator according to [1] or [2], wherein the vibrating film and the silicon member are bonded with each other with a resin layer, and the resin layer has a thickness of 0.01 μm or more and 0.5 μm or less.
[6] The MEMS vibrator according to any one of [1] to [3], wherein the vibrating film is bonded with the silicon member by a mechanical pressure.
[7] An oscillator comprising:
the MEMS vibrator according to any one of [1] to [6]; and
an oscillator IC.
[8] The oscillator according to [7], wherein the oscillator IC is sealed by wire bonding or flip-chip bonding.
[9] A compact actuator comprising the oscillator according to [7] or [8].
[10] A MEMS sensor for weighing an amount of an attached material, the MEMS sensor comprising the oscillator according to [7] or [8].
[11] A MEMS channel comprising the MEMS vibrator according to any one of [1] to [6].
[12] A micro bio reaction circuit comprising the MEMS vibrator according to any one of [1] to [6].

According to one or more embodiments of the present disclosure, there can be provided a MEMS vibrator that has excellent chemical resistance and an excellent mechanical strength and that is easily thinned, and an oscillator, a compact actuator, a MEMS sensor, a MEMS channel, and a micro bio reaction circuit each including the MEMS vibrator. Further, a simple-structure and high-performance silicon-MLG (Multi Layer Graphene) vibrator or silicon-MLG/MEMS oscillator is obtained, and MEMS devices that are light and compact and has characteristics of chemical and gas resistance are provided such as a high-sensitivity MEMS sensor or actuator that include the oscillator.

BRIEF DESCRIPTION OF THE DRAWINGS

FIG. 2 is a diagram showing one example of a conventional optical scanner including a Si wafer as a resonator.

FIGS. 3A-3B are diagrams each showing one example of a method for bonding a graphite film of one or more embodiments of the present disclosure with a silicon member supporting the film by a mechanical pressure.

FIGS. 4A-4B are diagrams each showing one example of a high-precision MEMS vibrator including a graphite film of one or more embodiments of the present disclosure.

FIGS. 5A-5B are diagrams each showing one example of an actuator including a graphite film of one or more embodiments of the present disclosure.

FIG. 6 is a diagram showing one example of a pressure sensor including a graphite film of one or more embodiments of the present disclosure.

DETAILED DESCRIPTION

Figure 1:
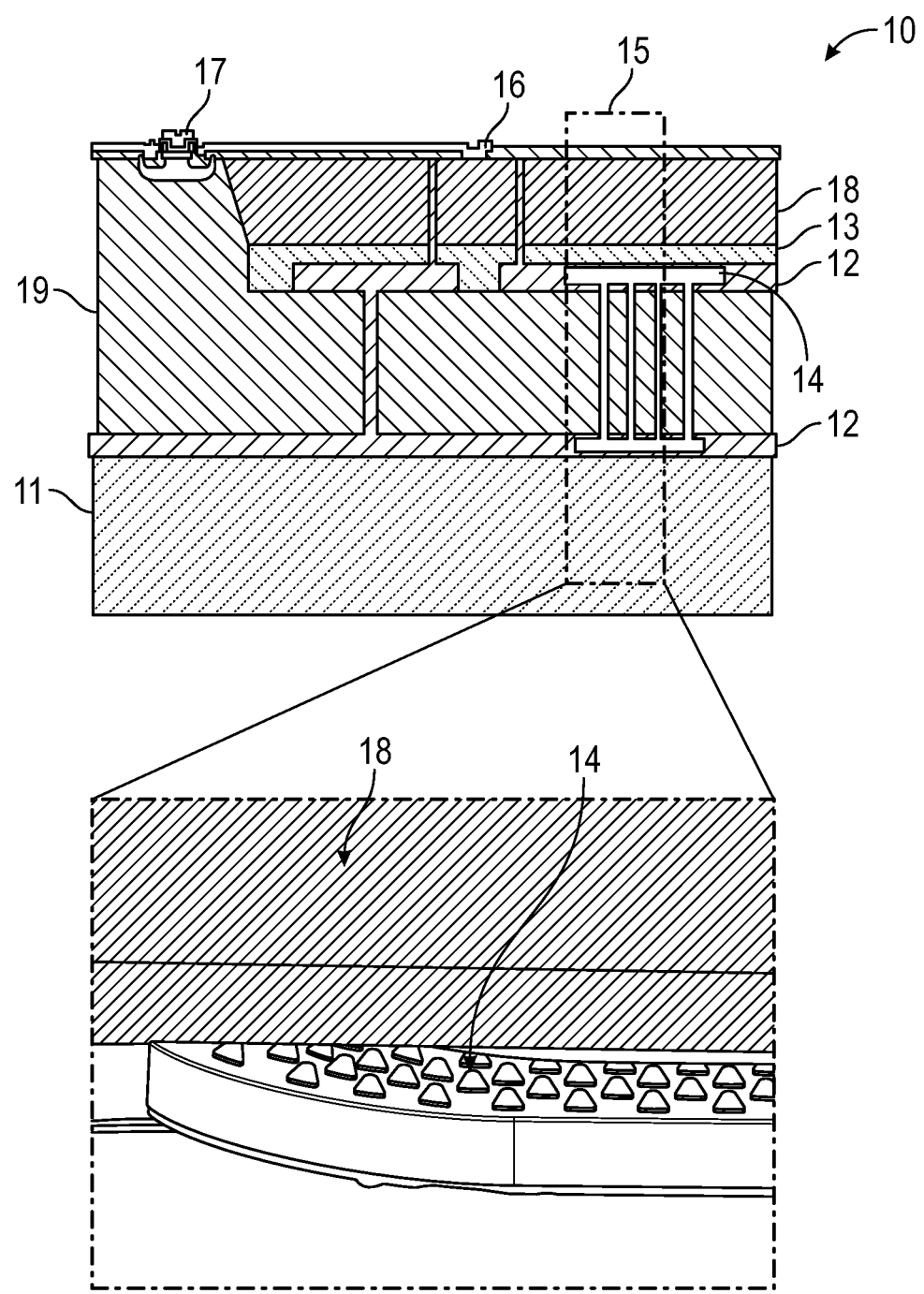
FIG. 1 is a diagram showing one example of a conventional silicon-MEMS oscillator.

A MEMS vibrator of one or more embodiments of the present disclosure is a graphite-MEMS vibrator having a graphite film as a resonator, specifically a MEMS vibrator that includes a vibrating film including a graphite film, and a silicon member supporting the vibrating film, and the one or more embodiments of present disclosure is characterized in that the graphite film has a thickness of 50 nm or more and less than 20 μm and a Young's modulus along a graphite film plane direction of 700 GPa or more.

The graphite film of one or more embodiments of the present disclosure exerts a high Young's modulus, a high density, and a high tensile strength as a polymer film having a prescribed thickness is baked at a high temperature and graphite is thus uniformly formed across the entire film.

(Conditions Fulfilled by Vibrating Film Including Graphite Film)

The thickness of the graphite film is determined according to handleability of the graphite film and ease of preparing a device, and is less than 20 μm, preferably 18 μm or less, more preferably 16 μm or less, most preferably 15 μm or less. The graphite film in such a range is capable of reducing the weight of graphite having a small specific gravity (for example, 2.24). The values of the Young's modulus, the tensile strength, and the electrical conductivity tend to increase as the thickness of the graphite film is decreased.

Further, the graphite film has a thickness of 50 nm or more, preferably 80 nm or more, more preferably 100 nm or more, most preferably 200 nm or more. The graphite film having a thickness of 50 nm or more becomes capable of transmitting, as a resonator, prescribed vibration to the exterior.

A graphene ribbon having about a single to 10 layers has a thickness of no more than about 0.34 nm to 3.4 nm and has no function as a resonator. Further, it is difficult for a CVD method to prepare multilayer graphene having mechanical characteristics necessary as a resonator when the thickness is set at 50 nm or more.

A method for measuring the thickness can be performed using a known device. For example, the thickness can be measured by a contact measurement method with a caliper or the like, by an optical measurement method with a laser displacement meter, spectroscopic ellipsometry, or the like, or by a section observation method with an SEM (Scanning Electron Microscope) or a TEM (Transmission Electron Microscope).

The graphite film has an elasticity (Young's modulus) along the graphite film plane direction of 700 GPa or more. The graphite film has an elasticity along the graphite film plane direction of preferably 800 GPa or more, most preferably 900 GPa or more. The graphite film has an elasticity along the graphite film plane direction of, for example, 1500 GPa or less, preferably 1100 GPa or less. These values of the Young's modulus are remarkably higher than the values of commercially available graphite products and are remarkably higher than the values of aluminum (Young's modulus: 70.3 GPa), copper (Young's modulus: 129.8 GPa), beryllium (Young's modulus: 287 GPa), and mica (Young's modulus: 210 GPa). Further, the highest value of the Young's modulus of a conventional graphite crystal is 1020 GPa, and one or more embodiments of the present disclosure also target a graphite film exceeding the highest value.

The Young's modulus of the graphite film becomes high as graphite is increased in quality and as the heat treatment temperature for graphitization is increased. The young's modulus of 700 GPa or more is achieved by a heat treatment temperature of about 2800° C.

The graphite film of one or more embodiments of the present disclosure may have a smaller Young's modulus along a graphite film thickness direction than the Young's modulus of the graphite vibrating plate described in Patent Document 1, but preferably has a mechanical strength of a prescribed Young's modulus or more along the graphite film thickness direction. The graphite film of one or more embodiments of the present disclosure preferably has a Young's modulus ($E_c$) along the graphite film thickness direction of preferably 40 GPa or more, more preferably 50 GPa or more and, for example, 500 GPa or less. A graphite single crystal has a Young's modulus ($E_a$) along a basal plane (a-b plane) direction of 1020 GPa, while having a Young's modulus ($E_c$) along a c-axis direction of about 36 GPa and being inferior in the Young's modulus along the thickness direction.

The Young's moduli along the graphite film thickness direction and the graphite film plane direction of the graphite film of one or more embodiments of the present disclosure are obtained by a conventionally known method, and can be obtained by, for example, a stationary test such as a tensile test (test piece: JIS G05567J II-6, measurement device: Autograph universal testing machine AG-IS manufactured by SHIMADZU CORPORATION), a compression test, or a torsion test, or a dynamic test such as a resonance method (test piece: JIS Z2280, measurement device: high-temperature Young's modulus measurement device EG-HT/JE manufactured by Nihon Techno-Plus Corp.), an ultrasonic pulse method (test piece: JIS Z2280, measurement device: burst wave acoustic velocity measurement device RAM-5000 manufactured by RITEC Inc.), or a pendulum method.

Particularly, a resonance method, in which a resonance frequency (characteristic vibration frequency) is measured by applying mechanically or electrically forced vibration to a test piece and a Young's modulus of the graphite film is calculated from the resonance, can be preferably used. In one or more embodiments of the present disclosure, a free resonance method which is the most general among resonance methods is mainly used. This method requires the test piece to be electrically conductive, and the graphite film has an excellent electrical conductivity. From such a viewpoint, the resonance method is preferably used.

The graphite film has a density of, for example, more than 2.1 g/cm$^3$, preferably 2.15 g/cm$^3$ or more, more preferably 2.17 g/cm$^3$ or more, further preferably 2.20 g/cm$^3$ or more. The graphite film has a density of, for example, 2.24 g/cm$^3$ or less. As the graphite film has a higher density, air or voids included in the film are decreased to easily increase the film strength (for example, tensile strength).

The graphite film of one or more embodiments of the present disclosure has an excellent mechanical strength and is stably capable of achieving a value of the tensile strength in the range of, for example, 50 to 100 MPa, preferably about 60 to 100 MPa, more preferably about 70 to 100 MPa. Therefore, the graphite film is singly capable of constituting a vibrating film, which means that the graphite film is capable of forming a vibrating film without impairing the excellent characteristics of the graphite film.

The tensile strength can be obtained by, for example, a method described in JIS K 7127 or ASTM D882.

The graphite film has an electrical conductivity of preferably 15000 S/cm or more, more preferably 17000 S/cm or more, further preferably 19000 S/cm or more. The graphite film has an electrical conductivity of preferably 27000 S/cm or less, more preferably 26000 S/cm or less. The electrical conductivity can be calculated from an electrical resistance measured by a known approach such as the van Der Pauw method or a general four-terminal method, and dimensions and a thickness of the sample.

Further, the graphite film has a surface roughness Ra of preferably less than 15 μm, more preferably 10 μm or less, further preferably 8 μm or less, further more preferably 5 μm or less. The lower limit is not particularly limited but may be, for example, 0.1 μm. The surface roughness of the graphite film is adjustable by applying a pressure during graphitization, or performing carbonization and/or graphitization while applying a tension from the exterior. The pressure applied during graphitization may be set at, for example, 80 kgf/cm$^2$ to 130 kgf/cm$^2$.

(Preparation of Graphite Film)

A method for producing the graphite film is not particularly limited as long as the graphite film satisfies the conditions of the mechanical characteristics and the thickness, but a preferable method is a polymer baking method in which a polymer film is heat-treated to graphitize the polymer film.

A raw material polymer used in the polymer baking method is an aromatic polymer such as an aromatic polyimide, a polyamide, polyparaphenylene vinylene, polyoxadiazole, polybenzimidazole, or polybenzoxazole. Among these aromatic polymers, an aromatic polyimide is particularly preferable.

In an approach for carbonizing and graphitizing an aromatic polyimide, a polymer film as a starting material is heated and carbonized in an inert gas. As the inert gas, nitrogen, argon, or a mixed gas of argon and nitrogen is preferably used. The carbonization is usually performed at a temperature of about 500° C. to 1000° C. The polyimide film is thermally decomposed at nearly 500 to 600° C. and becomes a carbonized film formed of almost only carbon at nearly 1000° C.

A graphitization reaction is performed in an inert gas and is most appropriately performed in an argon gas.

When the aromatic polyimide is used, the thickness of the aromatic polyimide is preferably 100 nm to 40 μm, more preferably 100 nm to 20 μm, most preferably 100 nm to 10 μm. The aromatic polyimide becomes almost half in thickness by the carbonization described above and the graphitization described below, so that the use of the aromatic polyimide having the thickness described above gives the graphite film having the objective thickness.

Meanwhile, the thickness of the graphite film obtained by a conventional polymer baking method is 20 μm or more. A reason why the graphite film that is produced by the polymer baking method and has a thickness of less than 20 μm is not commercialized is that it is difficult to establish a production process achieving a thickness of less than 20 μm. General polymer baking methods generate many wrinkles in a process of carbonization or graphitization and remarkably cause generation of wrinkles when a thickness of the graphite film becomes less than 20 μm. One or more embodiments of the present disclosure are capable of preventing the generation of wrinkles by carbonizing an aromatic polyimide film or graphitizing a carbonized film of the aromatic polyimide film while applying a tension to the film, or by graphitizing the carbonized film under pressure, and is capable of giving a film having a thickness of less than 20 μm.

In one or more embodiments of the present disclosure, necessary temperature (highest treatment temperature) for graphitization is 2800° C. or more. The treatment may be performed at a temperature of 2900° C. or more, 3000° C. or more and 3300° C. or less, as necessary. With the graphitization at 2800° C. or more, the graphite film having a film thickness of one or more embodiments of the present disclosure is capable of achieving the prescribed Young's modulus and tensile strength. The retention time at the highest treatment temperature is, for example, 10 minutes or more, preferably 30 minutes or more and may be 1 hour or more. The upper limit of the retention time at the highest treatment temperature is not particularly limited, but may be usually 5 hours or less, particularly about 3 hours or less.

When a pressure is applied during graphitization, the ambient pressure (gauge pressure) by an inert gas in a high-temperature furnace is, for example, 0.01 MPa or more, preferably 0.02 MPa or more, further preferably 0.05 MPa or more. The upper limit of the ambient pressure is not particularly limited but may be, for example, 2 MPa or less, particularly about 1.8 MPa or less.

In one or more embodiments of the present disclosure, in order to suppress wrinkles, it is recommended that a tensile stress be applied to the aromatic polyimide film or the carbonized film during carbonization or graphitization, or the carbonized film be graphitized under pressure, as described above.

The graphite film obtained by the method described above has characteristics of being less affected by environmental temperature due to the treatment at 2800° C. or more, and can be formed into a graphite resonator having both necessary thickness and high mechanical physical properties. The graphite resonator is useful for preparing a graphite-MEMS vibrator (particularly a broadband vibrator), and gives a high frequency resonance characteristics due to particularly having a high Young's modulus.

Hereinafter, the MEMS vibrator of one or more embodiments of the present disclosure is described with reference to examples shown in drawings.

The MEMS vibrator includes a vibrating film including the graphite film, and a silicon member (hereinafter, sometimes referred to as a silicon support) supporting the vibrating film, and the vibrating film is preferably bonded with the silicon support. In the bonding of the vibrating film with the silicon support, the graphite film needs to be bonded with the silicon support along a graphite film a-b plane. The bonding of the graphite film a-b plane with a silicon surface is preferably performed by direct bonding without an adhesive material, bonding with a metal layer or a resin layer, or contact bonding with a mechanical pressure.

The direct bonding of the graphite film a-b plane with the silicon surface without an adhesive material is the most excellent bonding method taking advantage of graphite characteristics. For the direct bonding, a mirror-finished graphite surface obtained by polishing may be compression-bonded with a mirrored silicon surface at normal temperature. In this procedure, the graphite surface and the silicon surface can each be surface-treated in vacuum and thus activated to achieve strong direct bonding. For the activation, there can be preferably used, for example, a method for activating the surfaces by an argon beam in vacuum and a method for activating the surfaces by a FAB gun.

The bonding of the graphite film a-b plane with the silicon surface is also achieved by a soldering method using a metal. The soldering is a technique in which a metal is melted by heat to be flowed into a gap between objects to be bonded and the objects are bonded by interdiffusion between the solder material and a base material. An alloy having a lower melting point than the melting points of members to be bonded can be melted and used as a kind of adhesive to bond the plurality of members without melting base materials themselves of the members.

The graphite film a-b plane and the silicon surface may be bonded with each other with a resin layer, and the resin layer has a thickness of preferably 0.01 µm or more and 0.5 µm or less, more preferably 0.02 µm or more, further preferably 0.05 µm or more.

The resin layer may be an acrylic adhesive, an epoxy adhesive, or the like. A general adhesive, such as an epoxy adhesive, that is soft is preferably used with a thickness of 1 µm or less so as not to impair the excellent mechanical characteristics of the graphite film.

The graphite film a-b plane may be bonded with the silicon surface by applying a mechanical pressure. FIG. 3 shows one example of such bonding. In FIG. 3A, a graphite film 31 is overlaid across a silicon support 32 having a groove 32a. A method for fixing the graphite film 31 between the silicon support 32 and a metal jig 33 is indicated. In the method, the metal jig 33 that has four columns 36 and has a U shape in a front view is put into the silicon support 32 on one of contact surfaces between the graphite film 31 and the silicon support 32, while allowing the metal jig 33 to straddle the graphite film 31. The columns 36 of the metal jig 33 are made from a metal, a carbon material, or silicon, inserted into holes provided on the silicon support 32, and can be fixed by pressing a rear surface of the metal jig 33.

On the other hand, FIG. 3B shows a method for overlaying a graphite film 31 across a silicon support 32 that has a groove 32a, and adjusting a tension of the graphite film 31 by compression-bonding the graphite film 31 with a metal jig 33 on one of contact surfaces between the graphite film 31 and the silicon support 32. A piezoelectric element 34 is fitted to a side of a base 32b of one end of the silicon support 32 to be sandwiched, and the tension is adjustable by expanding or contracting the piezoelectric element 34. The tension is also adjustable by disposing an electrostatic actuator or the like in the side of the base 32b of the one end.

The MEMS vibrator obtained described above constitutes an oscillator (MEMS oscillator) together with an oscillator IC.

The oscillator IC may be sealed by wire bonding or flip-chip bonding.

The MEMS vibrator of one or more embodiments of the present disclosure is applicable to an information communication field including an optical scanner and an optical micro encoder, a sensor field including various sensors such as an infrared sensor, an acceleration sensor, and a pressure sensor, a medical and bio field including a microprobe of a scanning microscope, a DNA chip, a micro reactor, and a medical flexible tube, and MEMS products such as a head of an inkjet printer, a micro pump, and a compact actuator.

Among these application examples, the MEMS vibrator and the MEMS oscillator are preferably used in a compact actuator, preferably used in a MEMS sensor for weighing the amount of an attached material, and preferably used in a MEMS channel or a micro bio reaction circuit.

The present application claims a benefit of priority based on Japanese Patent Application No. 2018-036682 filed on Mar. 1, 2018. All the contents described in Japanese Patent Application No. 2018-036682 filed on Mar. 1, 2018 are incorporated herein by reference.

EXAMPLES

Heretofore, a basic production process for preparing a silicon MEMS element using a graphite film has been described. Hereinafter, a device prepared using such a process is described with reference to examples.

<Film Thickness>

The thicknesses of a polyimide film as a polymer film and a graphite film had a margin of error of about ±5% depending on the measurement location of the films in the form of a film (sheet). Therefore, a ten-point average thickness of a resultant sheet was defined as the thickness of the sample in one or more embodiments of the present disclosure.

<Electrical Conductivity>

The electrical conductivity of the graphite film was measured by the van Der Pauw method. This method is the most appropriate method for measuring the electrical conductivity of a sample in the form of a thin film. The details of the measurement method is described in Experimental chemistry 9 (fourth series) electricity and magnetism (edited by The Chemical Society of Japan, issued by Maruzen Co., Ltd., (issued on Jun. 5, 1991 (Heisei 3)) p. 170. This method is characterized in that electrodes can be arranged in any four points of end portions in a thin film sample having any shape, to measure the electrical conductivity and that accurate measurement can be performed when the sample has a uniform thickness. In one or more embodiments of the present disclosure, the measurement was performed by using a 2 cm×2 cm sample and attaching a silver paste electrode to each of four corners of the sample. The measurement was performed using Resistivity/DC & AC Hall measurement system, ResiTest 8300 manufactured by TOYO Corporation.

<Young's Modulus>

The Young's modulus was measured by a free resonance method. This is a method for mechanically or electrically applying forced vibration to a test piece, measuring a resonance frequency (characteristic vibration frequency), and calculating a Young's modulus of the graphite film from the resonance frequency.

<Tensile Strength>

The tensile strength is measured on the basis of ASTM D882.

The graphite film was cut out into a size of 2×16 cm, and the cut-out film was reinforced at both ends with a 12.5-μm-thick polyimide tape. The measurement sample prepared was set in a vertical motorized test stand (EMX-1000N manufactured by IMADA CO., LTD.). The tensile speed was set at 5 mm/min, and the tensile strength was measured by a digital force gauge (ZTA-5N manufactured by IMADA CO., LTD.).

<Preparation of Polyimide Film>

A raw material polyimide film was prepared by the following method. Into 100 g of a 18% by mass DMF solution of polyamic acid synthesized from pyromellitic anhydride and 4,4'-diaminodiphenyl ether in the mole ratio of 1:1, a curing agent formed of 20 g of acetic anhydride and 10 g of isoquinoline was mixed, and the mixture was stirred, defoamed by centrifugal separation, then applied by casting onto an aluminum foil, and further a polyamic acid film having a uniform thickness in the range of 40 μm or less was prepared on the aluminum foil using a spin coater. The thickness of the film was adjusted by changing the concentration of the amid acid solution and the number of rotations. The polyamic acid film was heated at 120° C. for 150 seconds and at 300° C., 400° C., and 500° C. for 30 seconds each, and then the aluminum foil was removed. Thus, polyimide films having different thicknesses were prepared.

<Preparation of Graphite Film>

The polyimide films having different thicknesses were carbonized by raising the temperature to 1000° C. at a rate of 10° C./min in a nitrogen gas with use of an electric furnace and keeping the temperature at 1000° C. for 1 hour. Next, the resultant carbonized films were set in a graphitization furnace, and the temperature was raised to 3200° C. at a heating rate of 20° C./min in an argon atmosphere under a pressure of 0.10 MPa (1.0 kg/cm$^2$). The temperature was retained at 3200° C. for 30 minutes and thereafter lowered at a rate of 40° C./min to prepare graphite films. In the preparation, the thickness of the eventually obtained graphite films was approximately half the thickness of the raw material polyimide films. The resultant graphite films were films in which graphite layers were oriented in parallel with a graphite film plane direction and were highly oriented.

For use of the graphite film of one or more embodiments of the present disclosure as a vibrating film, the wrinkles generated in the carbonization and graphitization processes are preferably reduced. The reduction of the wrinkles in the carbonization process and the graphitization process was achieved by a flattening technique of graphitization under pressure and a flattening technique of baking while giving a tension. The graphitization under pressure is a method for simultaneously graphitizing a plurality of samples under pressure, while preventing the bonding between the samples. For example, the graphitization without pressure gave a surface roughness Ra value of 15 μm, whereas the graphitization under a pressure of 100 kgf could reduce the Ra value to as small as 5 to 3 μm. The tension baking method is a method for performing carbonization or graphitization while applying tension from the exterior. The samples with few wrinkle (Ra=0.5 μm) was prepared by this method.

The thickness, the electrical conductivity (S/cm), the Young's modulus (GPa) along the graphite film plane direction, and the value (MPa) of the tensile strength of the resultant graphite films are shown below. The value of the tensile strength is an average value of 10 samples obtained by measuring 12 samples cut out into a strip (width 2 cm, length 16 cm) and excluding the values of 2 samples that exhibited the minimum values. A reason why such measurement was performed is that the value of the tensile strength derives from a small scratch on a cut surface and such a sample is considered not to exhibit an accurate film strength.

(G1) Thickness: 14.2 ti m, electrical conductivity: 21000 S/cm, Young's modulus: 780 GPa, tensile strength: 56 MPa (G2) Thickness: 4.6 μm, electrical conductivity: 23900 S/cm, Young's modulus: 870 GPa, tensile strength: 62 MPa (G3) Thickness: 2.0 μm, electrical conductivity: 24300 S/cm, Young's modulus: 1020 GPa, tensile strength: 86 MPa (G4) Thickness: 1.2 μm, electrical conductivity: 21500 S/cm, Young's modulus: 970 GPa, tensile strength: 94 MPa (G5) Thickness: 0.72 μm, electrical conductivity: 22000 S/cm, Young's modulus: 860 GPa, tensile strength: 96 MPa (G6) Thickness: 0.24 μm, electrical conductivity: 21000 S/cm, Young's modulus: 800 GPa, tensile strength: 90 MPa (G7) Thickness: 0.06 μm, electrical conductivity: 20200 S/cm, Young's modulus: 720 GPa, tensile strength: 82 MPa Example 1

Embodiments according to the present disclosure are described on the basis of FIG. 4. FIG. 4A shows a high-precision MEMS vibrator 40 prepared by overlaying a graphite film 41 with a thickness of 50 nm or more and less than 20 μm across a silicon support 42 with two base portions 42b, and fixing the base portions 42b and the graphite film 41 by a bond between the base portions 42b and the graphite film 41 with a metal such as silver solder or with a uniformly applied resin such as a resist of submicron order, or through pressure bonding such as crimping. In the MEMS vibrator 40, the graphite film 41 is vibrated by applying vibration to one or both of the base portions 42b from a piezoelectric film (not illustrated) such as PZT. The vibration of the graphite film 41 can be detected by an electrostatic signal between the graphite film 41 and an electrode (not illustrated) disposed on an upper portion of the graphite film 41.

The resonance frequency of the MEMS vibrator 40 is 6 GHz when the graphite film 41 having a width of 5 µm and a length of 5 µm is used, and the MEMS vibrator 40 is capable of generating higher-frequency vibration than the resonance frequency (1.8 GHz) provided when a silicon resonator having the same size as the graphite film 41 is used. Further, as shown in FIG. 4B, a weight 43 movable in a wave propagation direction can be disposed on a surface of the graphite film 41 to freely change the resonance frequency.

Example 2

Embodiments of the present disclosure are described on the basis of FIG. 5. In an example of FIG. 5A, a high-stiffness compact actuator 50 was prepared by forming, on a base portion 52b of a silicon support 52, a composite that includes a piezoelectric film 54 and a graphite film 51 of one or more embodiments of the present disclosure in this order. In an example of FIG. 5B, a stacked body 58 including a graphite film is fixed at four points 59, and when a moving electrode or a fixed electrode is disposed, the stacked body 58 moves opposite to a prescribed acceleration direction 56 and the electrostatic capacitance progresses in an electrostatic capacitance progressing direction 57. The graphite film of one or more embodiments of the present disclosure can be utilized as a structural material of a spring with high-stiffness.

Example 3

Embodiments of the present disclosure are described on the basis of FIG. 6. Specifically, in a pressure sensor 60 illustrated as an example in the drawing, a short silicon member 62b, a tall silicon member 62c, and a silicon member 62a that includes two flat portions respectively having the same heights as the two silicon members are disposed on lower glass 61, a diaphragm 64 is overlaid between the silicon member 62b and the silicon member 62a in parallel with the lower glass 61, upper glass 65 is overlaid between the silicon member 62c and the silicon member 62a in parallel with the lower glass 61, and an NEG (Non-Evaporation Getter) 63 is disposed on the lower glass 61. A detection electrode 66 and a reference electrode 67 are disposed on a lower surface of the upper glass 65 in a space formed by the upper glass 65 and the diaphragm 64. In this example, a vibrator including the graphite film of one or more embodiments of the present disclosure is used as the diaphragm 64 of the pressure sensor. The pressure sensor 60 configured as described above is capable of detecting a gas pressure 68 with a precision 10 times or more than the precision of conventional pressure sensors.

DESCRIPTION OF REFERENCE SIGNS

10 Silicon-MEMS oscillator
11 Silicon substrate
12 $SiO_2$ layer
13 Si epitaxial layer
14 Comb-shaped silicon resonator
15 Enlarged portion
16 MEMS terminal
17 CMOS
18 Poly-Si layer
19 Si layer (SOI layer: Silicon on Insulator layer)
20 Optical scanner
21 Permanent magnet
22 Detection coil around Y-axis
23 Detection coil around X-axis
24 Glass
25 Si wafer
26 Mirror
27 Rotating plate around X-axis
28 Rotating plate around Y-axis
31, 41, 51 Graphite film
32 Silicon support
33 Metal jig
34 Piezoelectric element
40 MEMS vibrator
42 Silicon support
43 Weight
50 Actuator
52 Silicon support
52b Base portion
54 Piezoelectric film
56 Acceleration direction
57 Electrostatic capacitance progressing direction
60 Pressure sensor
61, 65 Glass
62a, 62b, 62c Silicon member
63 NEG (Non-Evaporation Getter)
64 Diaphragm
66 Detection electrode
67 Reference electrode
68 Gas pressure Although the disclosure has been described with respect to only a limited number of embodiments, those skilled in the art, having benefit of this disclosure, will appreciate that various other embodiments may be devised without departing from the scope of the present invention. Accordingly, the scope of the invention should be limited only by the attached claims.

The invention claimed is:

1. A MEMS vibrator comprising:
   a vibrating film including a graphite film; and
   a silicon member supporting the vibrating film,
   wherein the graphite film has a thickness of 50 nm or more and less than 20 µm,
   wherein the graphite film has a Young's modulus along a graphite film basal plane direction of 700 GPa or more, and
   wherein the graphite film is comprised of graphite layers that are oriented in parallel with the graphite basal film plane direction.

2. The MEMS vibrator according to claim 1, wherein the graphite film has a tensile strength of 50 MPa or more.

3. The MEMS vibrator according to claim 1, wherein the vibrating film is directly bonded with the silicon member.

4. The MEMS vibrator according to claim 1, wherein the vibrating film and the silicon member are bonded with each other with a metal layer.

5. The MEMS vibrator according to claim 1, wherein
   the vibrating film and the silicon member are bonded with each other with a resin layer, and
   the resin layer has a thickness of 0.01 µm or more and 0.5 µm or less.

6. The MEMS vibrator according to claim 1, wherein the vibrating film is bonded with the silicon member by a mechanical pressure.

7. An oscillator comprising:
the MEMS vibrator according to claim 1; and
an oscillator IC.

8. The oscillator according to claim 7, wherein the oscillator IC is sealed by wire bonding or flip-chip bonding.

9. A compact actuator comprising the oscillator according to claim 7.

10. A MEMS sensor for weighing an amount of an attached material, the MEMS sensor comprising the oscillator according to claim 7.

11. A MEMS channel comprising the MEMS vibrator according to claim 1.

12. A micro bio reaction circuit comprising the MEMS vibrator according to claim 1.

13. The MEMS vibrator according to claim 1, wherein the graphite film has a density of more than 2.1 g/cm$^3$.

* * * * *